(12) United States Patent
Inuiya (10) Patent No.: US 7,230,226 B2
(45) Date of Patent: Jun. 12, 2007

(54) PHOTOELECTRIC CONVERSION LAYER STACK TYPE COLOR SOLID-STATE IMAGE SENSING DEVICE

(75) Inventor: Masafumi Inuiya, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/377,408

(22) Filed: Mar. 17, 2006

(65) Prior Publication Data

US 2006/0208162 A1 Sep. 21, 2006

(30) Foreign Application Priority Data

Mar. 17, 2005 (JP) .......................... P.2005-077038

(51) Int. Cl.
*H01L 27/00* (2006.01)
*H01L 31/00* (2006.01)
(52) U.S. Cl. ................................. 250/208.1; 250/214.1
(58) Field of Classification Search ............. 250/208.1, 250/214.1
See application file for complete search history.

(56) References Cited

U.S. PATENT DOCUMENTS 6,841,816 B2 * 1/2005 Merrill et al. .............. 257/294

7,129,466 B2 * 10/2006 Iwasaki .................... 250/214.1
2003/0209651 A1 11/2003 Iwasaki

FOREIGN PATENT DOCUMENTS

| JP | 2002-083946 A | 3/2002 |
| WO | WO 99/39372 A2 | 8/1999 |
| WO | WO 99/56097 A1 | 11/1999 |

* cited by examiner

*Primary Examiner*—John R. Lee
(74) *Attorney, Agent, or Firm*—Sughrue Mion, PLLC (57) ABSTRACT

A solid-state image sensing device comprising: a silicon substrate; a photoelectric conversion layer provided for absorbing a green light component to generate optical charge; and photodiodes provided in a shallow portion and in a deep portion respectively in a depth direction of the silicon substrate, wherein the solid-state image sensing device further comprises a trimming layer provided between the photoelectric conversion layer and the silicon substrate for adjusting intensity of each of respective color light components of the light which is transmitted through the photoelectric conversion layer so as to be made incident on the photodiodes.

7 Claims, 6 Drawing Sheets

QUINACRIDONE COMPOUND (PR122)

Alq

TRANSMITTANCE    REAL CHARACTERISTIC

FIG. 4B

CHARACTERISTIC OF TRIMMING FILTER

FIG. 4C

TOTAL OF CHARACTERISTICS
SHOWN IN FIGS. 4A AND 4B

FIG. 5

FIG. 6

PHOTOELECTRIC CONVERSION LAYER STACK TYPE COLOR SOLID-STATE IMAGE SENSING DEVICE

FIELD OF THE INVENTION

The present invention relates to a single plate type color solid-state image sensing device for detecting signals of the three colors of red (R), green (G) and blue (B) per pixel. Particularly, it relates to a photoelectric conversion layer stack type color solid-state image sensing device which can sense a high-sensitivity high-resolution color image with good color reproducibility.

BACKGROUND OF THE INVENTION

In a background-art single plate type color solid-state image sensing device represented by a CCD image sensor or a CMOS image sensor, a mosaic of color filters of R, G and B is mounted on an array of pixels (photodiodes) which perform photoelectric conversion. Color signals outputted from the respective pixels of the color solid-state image sensing device in accordance with the color filters are processed to generate a color image.

The color solid-state image sensing device provided with such a mosaic of color filters, however, has a disadvantage of low light utilization efficiency and low sensitivity because each of the color filters absorbs two thirds of incident light when the color filters are primary color type filters (of the three colors of R, G and B). There is another disadvantage of low resolution, especially, conspicuous false color because no more than one color signal (of a color) can be obtained from each pixel.

In order to overcome such disadvantages, therefore, an image sensing device having a stack of three photoelectric conversion layers has been researched and developed, for example, as described in JP-T-2002-502120 (corresponding to WO 99/39372) and JP-A-2002-83946. This image sensing device has a pixel structure in which, for example, photoelectric conversion layers for generating signal charge (electrons or holes) in response to blue (B) light, green (G) light and red (R) light respectively are stacked as three layers successively viewed from a light incidence surface. Moreover, this image sensing device has signal reading circuits which are provided in accordance with pixels respectively so that signal charges optically generated in the photoelectric conversion layers respectively are read independently. In the case of the image sensing device, almost of the incident light is subjected to photoelectric conversion so that utilization efficiency of visible light is almost about 100%. In addition, the image sensing device has such a structure that color signals of the three colors of R, G and B can be obtained in one pixel. Thus, there is an advantage that the image sensing device can obtain a good image with high sensitivity and high resolution (inconspicuous false color).

In an image sensing device described in JP-T-2002-513145 (corresponding to WO 99/56097), three layers of wells (photodiodes) for detecting optical signals are provided in a silicon substrate so that signals different in spectral sensitivity are taken out in accordance with difference in depth of the silicon substrate. That is, the image sensing device is designed so that a signal having a peak in blue (B) is taken out from a pn junction portion in the surface of the silicon substrate, a signal having a peak in green (G) is taken out from a pn junction portion in an intermediate portion of the silicon substrate and a signal having a peak in red (R) is taken out from a pn junction portion in a deep portion of the silicon substrate. Similarly to the image sensing device described in JP-T-2002-502120 and JP-A-2002-83946, this image sensing device can sense a good image with high sensitivity and high resolution (inconspicuous false color).

In the image sensing device described in JP-T-2002-502120 and JP-A-2002-83946, the three photoelectric conversion layers need to be stacked on the substrate, and it is difficult to form vertical wires by which pixel electrode layers provided separately in accordance with the photoelectric conversion layers and the pixels are connected to the signal reading circuits provided on the substrate, respectively. There arises a problem that the production process is complex to bring increase in cost and reduction in production yield.

Figure 6:
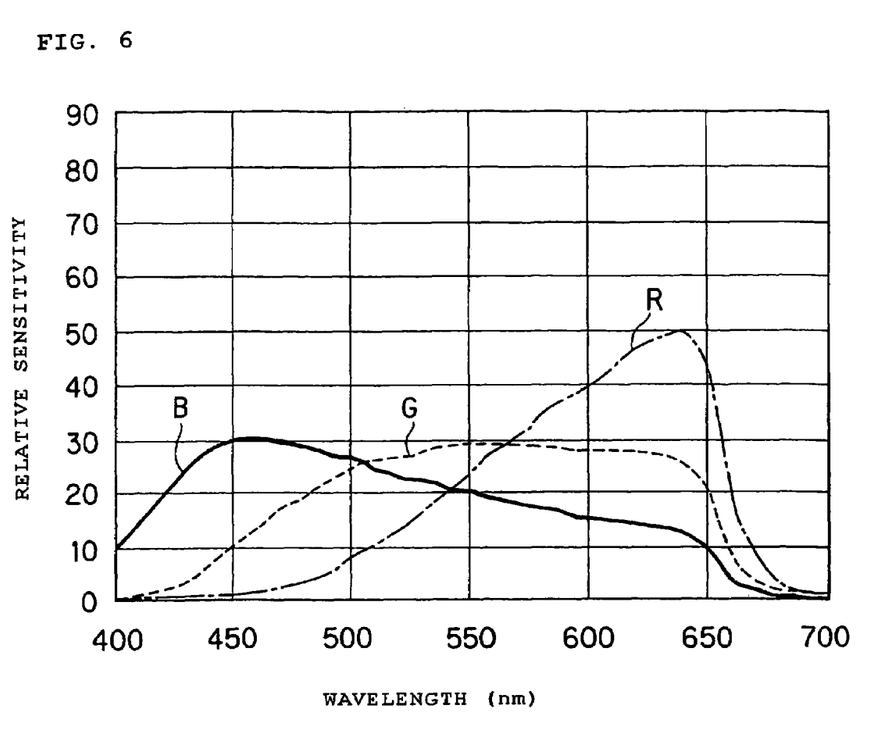
FIG. 6 is a graph showing spectral sensitivity characteristic of photodiodes in a multilayer structure according to the background art.

On the other hand, in the image sensing device according to JP-T-2002-513145, separation of spectral sensitivity characteristics of the color signals of R, G and B is not sufficient as shown in FIG. 6 so that color reproducibility is poor. In addition, it is necessary to add and subtract output signals for obtaining true R, G and B signals. There is a problem that S/N is deteriorated by the addition and subtraction process.

An image sensing device described in JP-A-2003-332551 (FIG. 5) (corresponding to US Publication 2003/0209651) has been therefore proposed as an image sensing device to solve the problems belonging to JP-T-2002-502120 and JP-A-2002-83946 and JP-T-2002-513145. This image sensing device is of a hybrid type between the image sensing device described in JP-T-2002-502120 and JP-A-2002-83946 and the image sensing device described in JP-T-2002-513145. That is, this image sensing device is configured in such a manner that while only one photoelectric conversion layer having sensitivity to green (G) light is stacked as an upper layer on a silicon substrate, two pn junction portions (photodiodes) are provided in the silicon substrate in the depth direction so that a blue (B) light signal is taken out from the pn junction portion in a shallow portion of the silicon substrate and a red (R) light signal is taken out from the pn junction portion in a deep portion of the silicon substrate.

Since this image sensing device has only one photoelectric conversion layer, there is an advantage that a process for producing the image sensing device is so simple that increase in production cost can be suppressed and reduction in production yield can be almost avoided. In addition, the image sensing device is designed in such a manner that green (G) light is absorbed by the photoelectric conversion layer so that only blue (B) light and red (R) light can be made incident on the silicon substrate. Thus, separation of spectral sensitivity characteristics of the pn junction portion for blue light and the pn junction portion for red light in the silicon substrate can be improved, so that color reproducibility becomes good and an image with good S/N can be sensed.

SUMMARY OF THE INVENTION

In the hybrid type color solid-state image sensing device described in JP-A-2003-332551 (FIG. 5), however, color separation of R, G and B becomes insufficient unless the spectral sensitivity characteristic of the photoelectric conversion layer for absorbing green light is ideal. Thus, there is a problem that the hybrid type color solid-state image sensing device cannot sense a color image with good color reproducibility. Moreover, development cost for a photoelectric conversion layer material exhibiting ideal spectral sensitivity characteristic is so high that there is another problem that the hybrid type color solid-state image sensing device cannot be provided inexpensively.

An object of the invention is to provide inexpensively a hybrid photoelectric conversion layer stack type color solid-state image sensing device exhibiting high color separation performance to make it possible to sense a color image with good color reproducibility.

The hybrid photoelectric conversion layer stack type color solid-state image sensing device according to the invention is a photoelectric conversion layer stack type color solid-state image sensing device including: a silicon substrate; a photoelectric conversion layer stacked as an upper layer on the silicon substrate and provided for absorbing a green light component to generate optical charge; and photodiodes formed in a shallow portion and in a deep portion respectively in a depth direction of the silicon substrate so that light entering the silicon substrate is separated into a blue light component and a red light component by wavelength dependence of absorbance due to silicon so that optical charge generated in the shallow portion of the silicon substrate is detected and converted into a signal based on the blue light component by the photodiode located in the shallow portion whereas optical charge generated in the deep portion of the silicon substrate is detected and converted into a signal based on the red light component by the photodiode in located in the deep portion, wherein the photoelectric conversion layer stack type color solid-state image sensing device further includes a trimming layer provided between the photoelectric conversion layer and the silicon substrate for adjusting intensity of each of respective color light components of the light which is transmitted through the photoelectric conversion layer so as to be made incident on the photodiodes.

Preferably, in the photoelectric conversion layer stack type color solid-state image sensing device according to the invention, the trimming layer is made of a material which is formed so that spectral sensitivity characteristic of the light transmitted through both the photoelectric conversion layer and the trimming layer exhibits a peak in a wavelength range of from 500 nm to 600 nm and a half-value width of not higher than 80 nm.

Preferably, in the photoelectric conversion layer stack type color solid-state image sensing device according to the invention, the trimming layer is made of a material which is formed so that spectral sensitivity characteristic of the light transmitted through both the photoelectric conversion layer and the trimming layer exhibits a peak in a wavelength range of from 530 nm to 570 nm and a half-value width of not higher than 50 nm.

According to the invention, a photoelectric conversion layer can be formed from an existing material to obtain high color separation performance to thereby make it possible to sense a color image with high color reproducibility.

DETAILED DESCRIPTION OF THE INVENTION

An embodiment of the invention will be described below with reference to the drawings.

Figure 1:
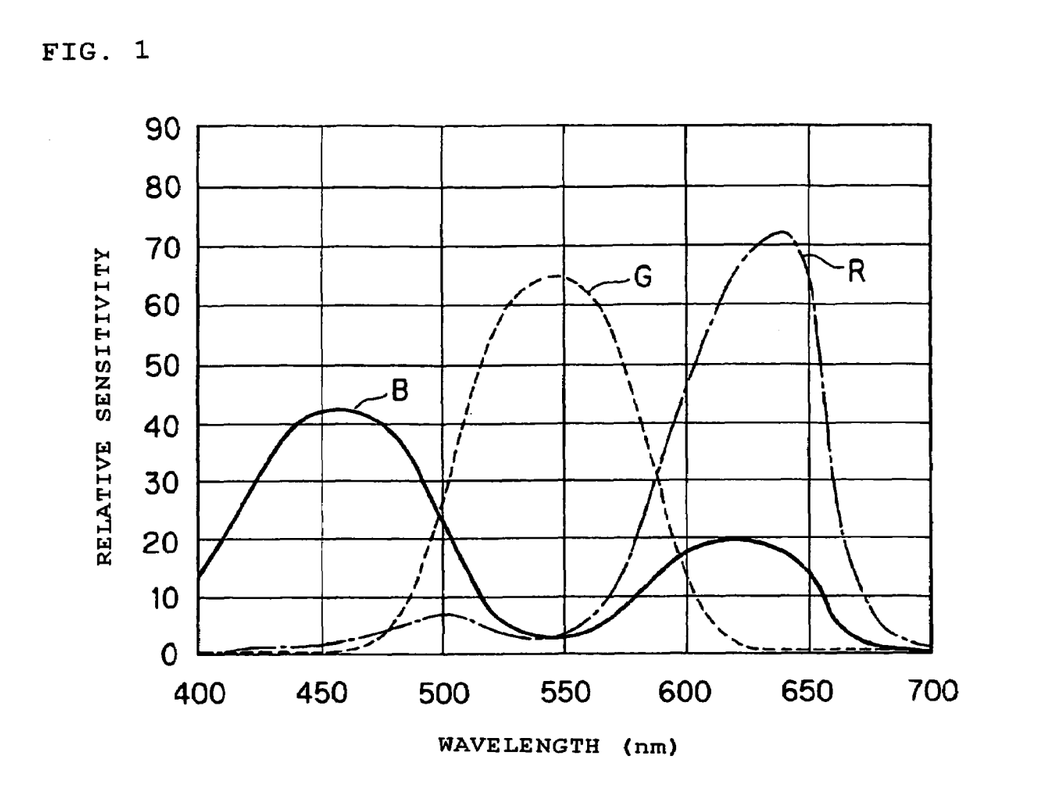
FIG. 1 is a graph showing ideal spectral sensitivity characteristic of a hybrid photoelectric conversion layer stack type color solid-state image sensing device according to an embodiment of the invention.

FIG. 1 is a graph showing ideal spectral sensitivity characteristic of R, G and B which is intended to be achieved by a hybrid photoelectric conversion layer stack type color solid-state image sensing device according to the embodiment of the invention.

The photoelectric conversion layer stack type color solid-state image sensing device according to the embodiment is configured so that green (G) light with an intermediate wavelength is converted into an electric signal by a photoelectric conversion layer provided as an upper layer on a semiconductor substrate while blue (B) light is converted into an electric signal by a shallow one of two photodiodes provided in the depth direction of the semiconductor substrate and red (R) light is converted into an electric signal by a deep one of the two photodiodes.

FIG. 6 shows spectral sensitivity characteristic of a color solid-state image sensing device (see JP-T-2002-513145) which has three photodiodes provided in the depth direction of a semiconductor substrate and which is configured so that light is separated into light components with the three colors of R, G and B by wavelength dependence of absorbance due to the silicon substrate. If G characteristic shown in FIG. 6 is made close to the ideal G characteristic of the photoelectric conversion layer, B characteristic and R characteristic shown in FIG. 6 can be made close to the ideal B characteristic and the ideal R characteristic shown in FIG. 1.

To produce a photoelectric conversion layer having the ideal G characteristic as its spectral sensitivity characteristic, there is a problem of increase in material development cost. In this embodiment, therefore, a photoelectric conversion layer is produced from an existing material so that the photoelectric conversion layer can absorb green light while a trimming layer is used in combination with the photoelectric conversion layer so that the trimming layer can correct a portion of the spectral sensitivity characteristic which cannot be made the ideal G sensitivity characteristic.

Figure 2:
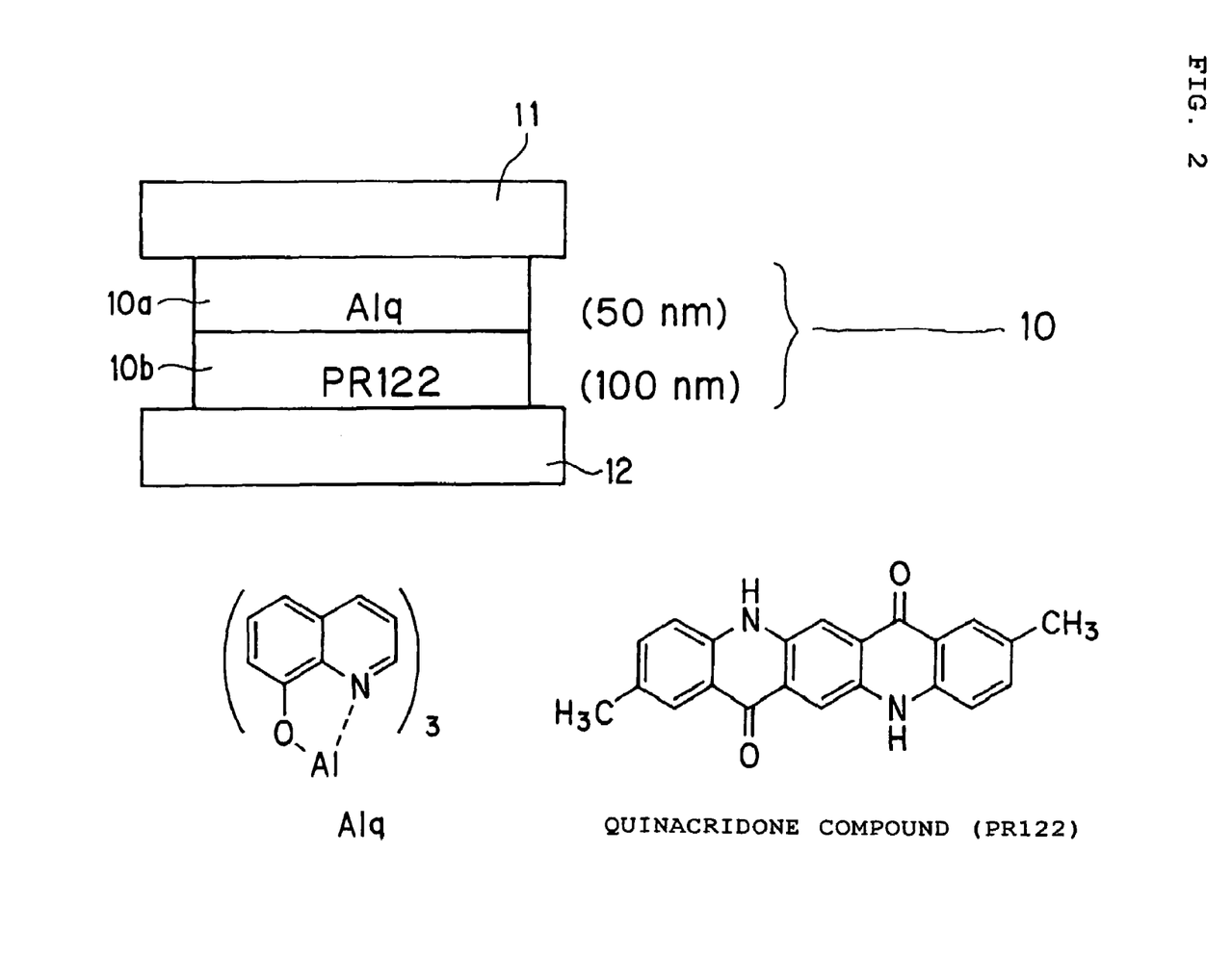
FIG. 2 is a view for explaining a photoelectric conversion layer used in the hybrid photoelectric conversion layer stack type color solid-state image sensing device according to the embodiment of the invention.

FIG. 2 is a view showing an example of the photoelectric conversion layer for performing photoelectric conversion while absorbing green light. The photoelectric conversion layer 10 is sandwiched between a common electrode layer 11 and a pixel electrode layer 12. In this embodiment, the photoelectric conversion layer 10 is formed as a two-layer structure with an Alq layer 10a and a quinacridone compound layer 10b.

Figure 3:
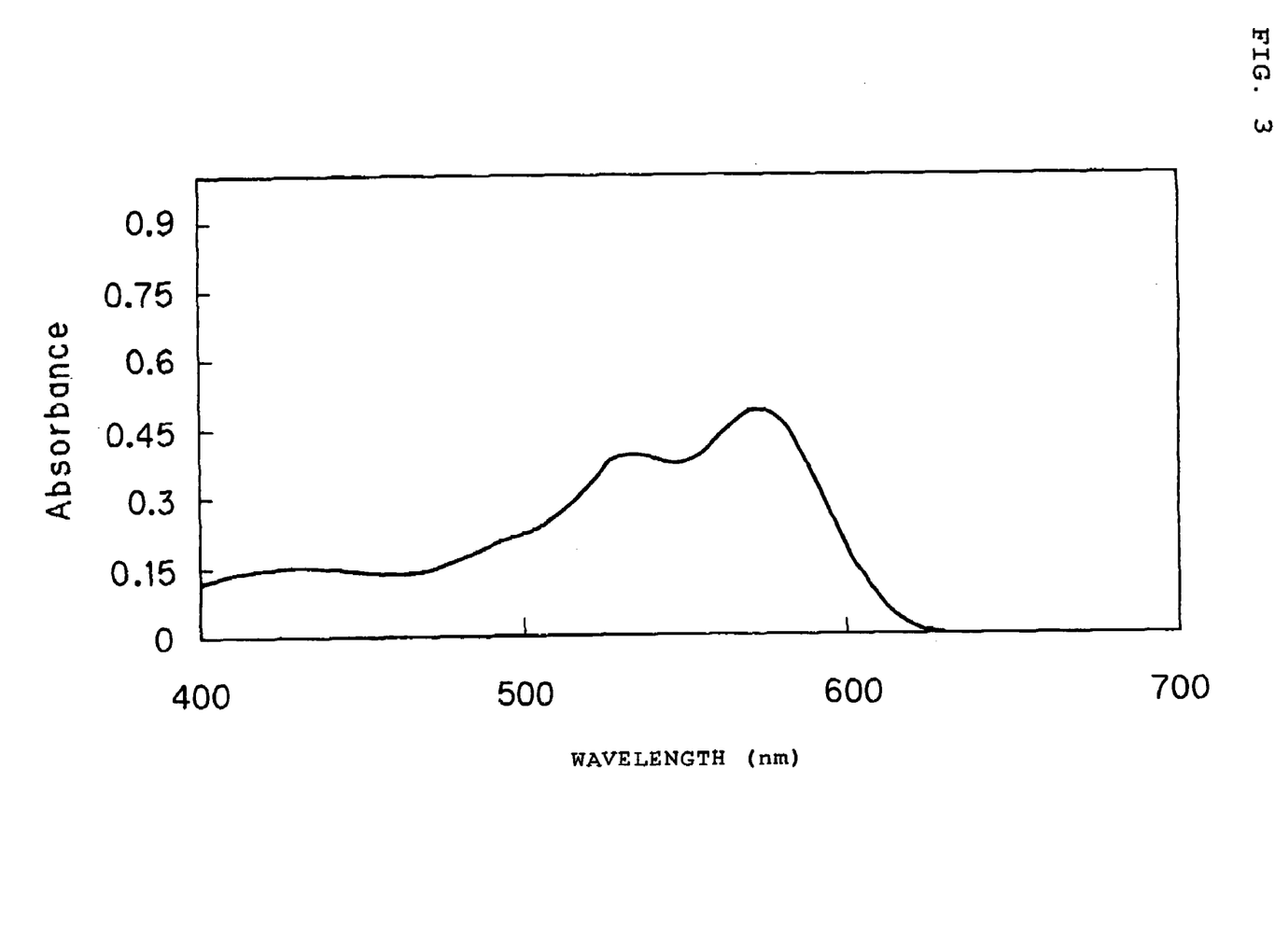
FIG. 3 is a graph showing absorbance characteristic of the photoelectric conversion layer depicted in FIG. 2.

FIG. 3 is a graph showing the absorbance of the photoelectric conversion layer 10 shown in FIG. 2 with respect to the wavelength of light. Although it is apparent from this graph that the photoelectric conversion layer 10 absorbs green light with wavelengths near 550 nm, the characteristic shown in this graph is different from the ideal G characteristic shown in FIG. 1, that is, the absorbance peak in this graph is not 550 nm.

Figure 4A:
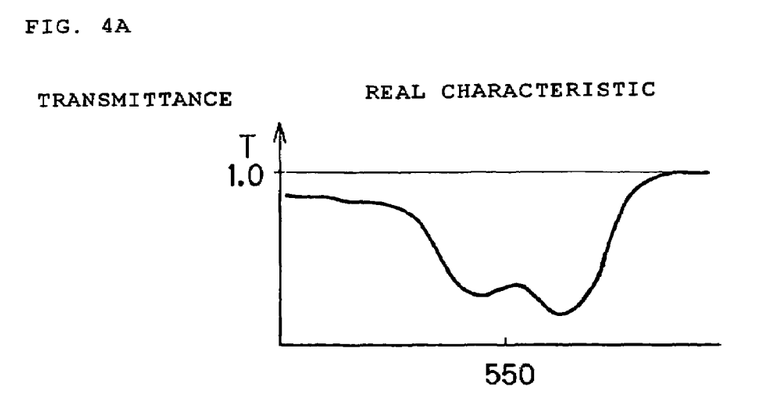
FIGS. 4A to 4C are views for explaining a method using a trimming layer in combination with the photoelectric conversion layer depicted in FIG. 2 in order to achieve ideal G characteristic.
Figure 4B:
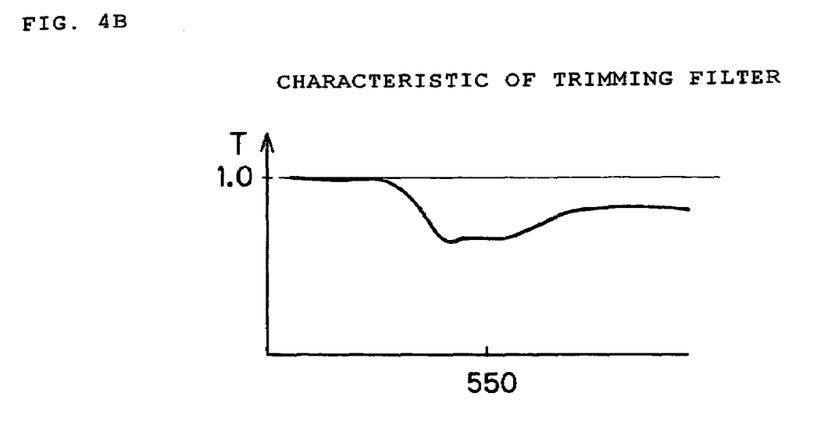
Figure 4C:
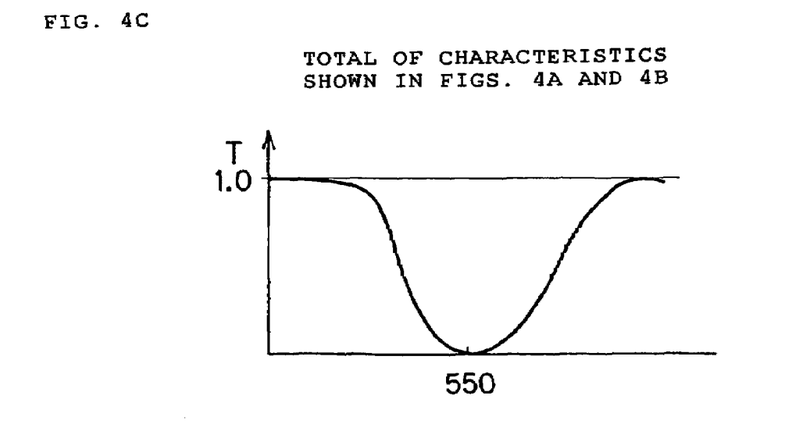

In this embodiment, therefore, the photoelectric conversion layer 10 having transmittance shown in FIG. 4A (which is equivalent to inversion of the characteristic shown in FIG. 3) and the trimming layer having transmittance shown in FIG. 4B are used in combination so that total transmittance characteristic of the two shown in FIG. 4C is made close to transmittance characteristic of the ideal G characteristic (which is equivalent to inversion of the ideal G characteristic shown in FIG. 1).

The trimming layer for green light designates a layer which can adjust intensity of blue light, green light and red light transmitted through the photoelectric conversion layer 10 to thereby change light received by the photodiodes of the silicon substrate which are provided for converting blue light and red light into electric signals respectively. When the trimming layer is used in combination with the photoelectric conversion layer 10, the spectral sensitivity characteristic of the photodiodes can be corrected to improve color reproducibility.

Preferably, the trimming layer contains a dye exhibiting a local maximum value of spectral absorption in a range of from 500 nm to 600 nm. Further preferably, the trimming layer contains a dye exhibiting a local maximum value of spectral absorption in a range of from 510 nm to 590 nm, and particularly preferably from 530 nm to 570 nm. Green light with wavelengths around 550 nm can be cut off perfectly by the dye, so that the green light can be prevented from reaching the photodiodes in the lower side. Preferably, the trimming layer contains a dye having a local maximum value of spectral absorption in a range of from 450 nm to 550 nm and/or a dye having a local maximum value of spectral absorption in a range of from 550 nm to 600 nm. Spectra of blue light and red light received by the photodiodes in the lower side can be separated from the spectrum of green light by these dyes, so that color reproducibility can be improved.

Preferably, the local maximum value of spectral absorption due to the dye is in a range of from 0.3 to 2.0 in terms of absorbance. Although high absorbance is preferable for color separation, the sensitivities of the photodiodes in the lower side are lowered by absorption due to the absorption limit of the dye if absorbance is too high. Accordingly, there is a suitable absorbance range. From this point of view, the half-value width of absorption due to the dye is preferably selected to be not higher than 80 nm, further preferably, not higher than 50 nm.

The wavelength of spectral absorption and the absorbance can be calculated on the basis of spectral absorption of the trimming layer which is measured with a general spectrophotometer by reference to air.

Any dye may be used as long as it can satisfy the aforementioned requirements. Preferably, a water-soluble dye, an oil-soluble dye or a solid-state dispersed dye excellent in heat resistance and light resistance may be used. Two or more kinds of these dyes may be used in combination.

The trimming layer can be formed by a known method according to the background art. For example, there is a known method in which a mordant layer made of a hydrophilic high-molecular substance such as gelatin, casein, glue or polyvinyl alcohol is provided on a substrate and in which a pigment with a predetermined absorption wavelength is added or applied to the mordant layer to thereby form a coloring layer. There is also a known method using a coloring resin containing a certain kind of coloring material dispersed into a transparent resin. For example, a coloring resin layer made of a mixture of a polyamino resin and a coloring material can be used as disclosed in JP-A-58-46325, JP-A-60-78401, JP-A-60-184202, JP-A-60-184203, JP-A-60-184204, JP-A-60-184205, etc.

A colorant using a photosensitive polyimide resin may be used. A coloring material may be dispersed in an aromatic polyimide resin which contains a photosensitive group described in JP-B-7-113685 in a molecule and which can be hardened into a cured layer at a temperature not higher than 200° C. A pigment described in JP-B-7-69486 may be used in a dispersed coloring resin. In this embodiment, a dielectric multiple layers can be preferably used. The wavelength dependence of transmittance of the dielectric multiple layers is so sharp that the dielectric multiple layers can be used preferably.

Preferably, the trimming layer is electrically insulated by an electrically insulating layer. The electrically insulating layer can be made of a transparent electrically insulating material such as glass, polyethylene, polyethylene terephthalate, polyether sulfone or polypropylene. Silicon nitride, silicon oxide or the like may be preferably used as the material of the electrically insulating layer. A layer of silicon nitride formed by plasma CVD is so high in denseness and so good in transparency that the silicon nitride layer can be preferably used.

Figure 5:
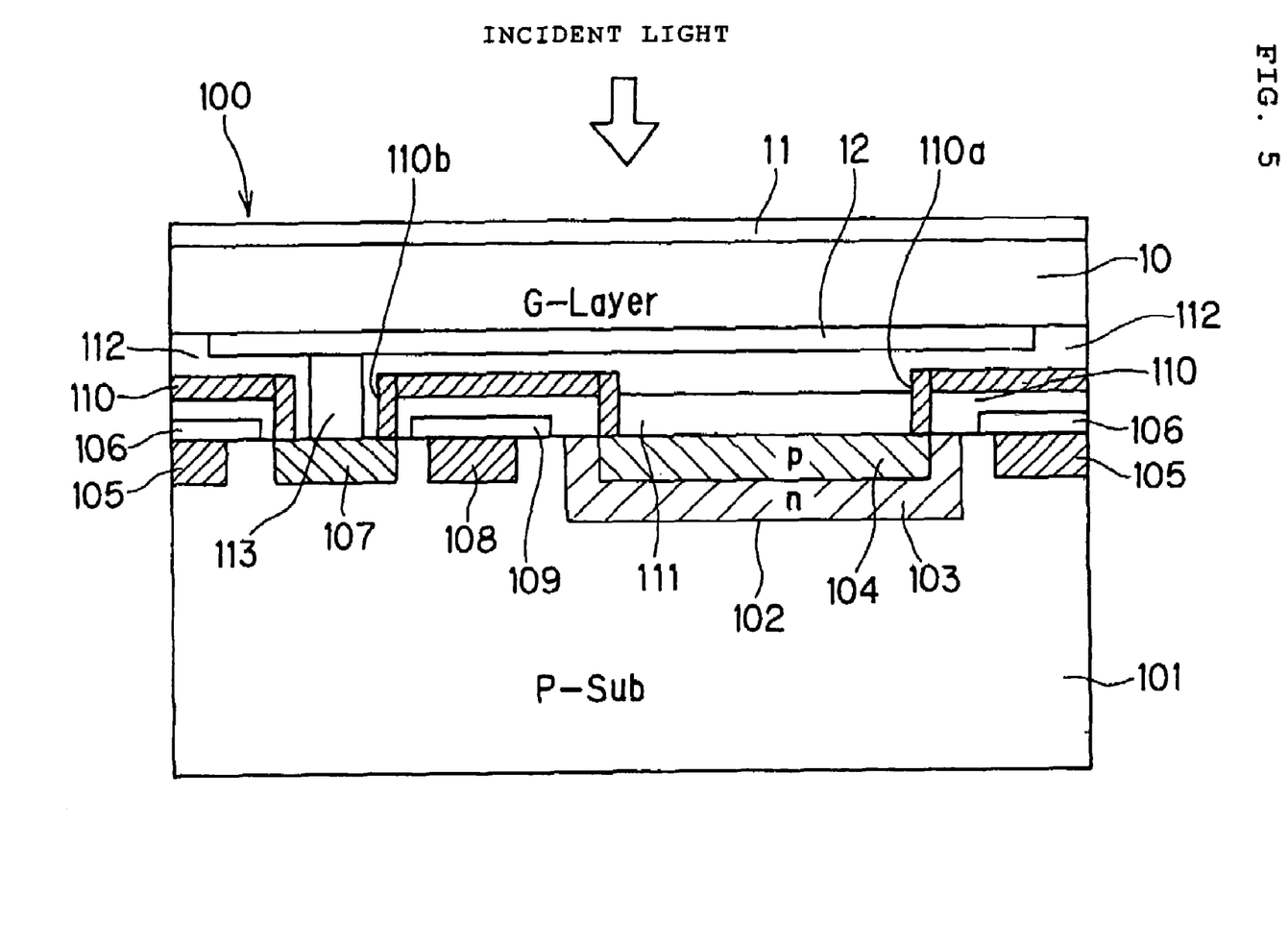
FIG. 5 is a schematic sectional view of each unit cell in the hybrid photoelectric conversion layer stack type color solid-state image sensing device according to the embodiment of the invention.

FIG. 5 is a schematic sectional view of each unit cell in a hybrid photoelectric conversion layer stack type color solid-state image sensing device according to an embodiment of the invention. Unit cells as shown in FIG. 5 are arranged lengthwise and crosswise two-dimensionally to thereby form a color solid-state image sensing device.

In the color solid-state image sensing device 100, an n-type semiconductor layer 103 is formed in a deep portion of a surface of a p-type semiconductor substrate 101 where a pixel region 102 is provided. A p-type semiconductor layer 104 is formed on the n-type semiconductor layer 103. As a result, a pn junction formed between the semiconductor layers 104 and 103 constitutes a blue light detection photodiode while a pn junction formed between the semiconductor layer 103 and the semiconductor substrate 101 constitutes a red light detection photodiode.

A charge transfer path 105 is formed in the surface of the semiconductor substrate 101 so as to be adjacent to the pixel region 102. A transfer electrode 106 is formed on the charge transfer path 105. When a read pulse is applied to the transfer electrode 106, signal charges stored in the blue light detection photodiode and the red light detection photodiode are read into the charge transfer path 105 respectively and transferred along the charge transfer path 105 respectively, so that the signal charges are output from the color solid-state image sensing device 100.

A signal charge storage region 107 for green (G) light is formed in a proper position slightly far from the pixel region 102 in the surface of the semiconductor substrate 101. A charge transfer path 108 is formed between the signal charge storage region 107 and the pixel region 102. A transfer electrode 109 is formed on the charge transfer path 108.

When a read pulse is applied to the transfer electrode 109, signal charge stored in the signal charge storage region 107 is read into the charge transfer path 108 and transferred along the charge transfer path 108, so that the signal charge is output from the color solid-state image sensing device 100.

A shading layer 110 is stacked on the surface of the semiconductor substrate 101. An opening 110a is formed in the shading layer 110 so as to be provided above photo acceptance surfaces of the blue light detection photodiode and the red light detection photodiode. An opening 110b is formed in the shading layer 110 so as to be provided above the signal charge storage region 107.

A trimming layer 111 for green light as described above is provided in the inside of the opening 101a so that the whole photo acceptance surfaces of the photodiodes are covered with the trimming layer 111.

The shading layer 110 is buried in a transparent electrically insulating layer 112 such as a silicon oxide layer. A transparent pixel electrode layer 12 as described in FIG. 2 is stacked on the electrically insulating layer 112 so as to be separate from pixel electrode layers for adjacent pixels. For example, the pixel electrode layer 12 is made of ITO or the like. The pixel electrode layer 12 and the signal charge storage region 107 are electrically connected to each other by a vertical wire 113 such as a tungsten plug through the opening 110b.

A photoelectric conversion layer 10 formed as a sheet common with all pixels is stacked on the pixel electrode layer 12. The photoelectric conversion layer 10 is made of a combination of Alq and a quinacridone compound as described in FIG. 2. A transparent common electrode layer 11 of ITO or the like formed as a sheet common with all pixels is stacked on the photoelectric conversion layer 10. Preferably, an infrared screening filter, an ultraviolet screening filter, a protective layer or the like may be provided on the transparent common electrode layer 11.

When light from a subject is incident on the hybrid photoelectric conversion layer stack type color solid-state image sensing device 100 configured as described above, a green (G) light component of the incident light is absorbed by the photoelectric conversion layer 10 so that optical charge corresponding to the intensity of incidence of the green (G) light component is generated in the photoelectric conversion layer 10. When a bias voltage is applied between the common electrode layer 11 and the pixel electrode layer 12, the optical charge is moved to the signal charge storage region 107 rapidly via the vertical wire 113.

Other light components of the incident light than the light component absorbed by the photoelectric conversion layer 10 are made incident on the trimming layer 111. The light transmitted through the trimming layer 111 is light from which the spectral sensitivity portion of the ideal G characteristic shown in FIG. 1 has been already eliminated. That is, the light transmitted through the trimming layer 111 is a mixture of a blue light component and a red light component. The light enters the inside of the semiconductor substrate 101.

The blue light component short in wavelength is chiefly absorbed by the shallow portion of the semiconductor substrate 101 to thereby generate optical charge. This optical charge is stored in the blue light detection photodiode. The red light component long in wavelength chiefly reaches the deep portion of the semiconductor substrate 101 to thereby generate optical charge. This optical charge is stored in the red light detection photodiode.

The signal charge stored in the signal charge storage region 107 in accordance with the green (G) light component, the signal charge stored in the photodiode in the shallow portion in accordance with the blue (B) light component and the signal charge stored in the photodiode in the deep portion in accordance with the red (R) light component are read into the charge transfer paths respectively and transferred along the charge transfer paths respectively, so that the signal charges are output from the solid-state image sensing device 100.

In this manner, the color solid-state image sensing device 100 according to the embodiment is configured so that the intensities of respective color light components of light transmitted through the photoelectric conversion layer 10 absorbing the green light component are readjusted by the trimming layer 111 so that a mixture of the blue light component and the red light component after removal of the green light component to be absorbed by the photoelectric conversion layer 10 is made incident on the photodiodes in the semiconductor substrate. Accordingly, color separation performance of R, G and B is improved so that a color image with high color reproducibility can be sensed.

Although the embodiment shown in FIG. 5 has been described on the case where signal reading circuits are formed from charge transfer paths equivalent to those in a CCD image sensor according to the background art, it is a matter of course that the signal reading circuits may be formed not from the charge transfer paths but from MOS transistors equivalent to those in a CMOS image sensor according to the background art.

In a hybrid photoelectric conversion layer stack type color solid-state image sensing device according to the invention, color separation characteristic of photodiodes provided in a silicon substrate can be improved to thereby make it possible to sense a high-sensitivity high-resolution color image with good color reproducibility. Moreover, the hybrid photoelectric conversion layer stack type color solid-state image sensing device can be produced inexpensively. Accordingly, the invention is useful when the hybrid photoelectric conversion layer stack type color solid-state image sensing device is used in place of the CCD or CMOS image sensor according to the background art.

This application is based on Japanese Patent application JP 2005-77038, filed Mar. 17, 2005, the entire content of which is hereby incorporated by reference, the same as if set forth at length.

What is claimed is:

1. A solid-state image sensing device comprising:
 a silicon substrate;
 a photoelectric conversion layer provided for absorbing a green light component to generate optical charge; and
 photodiodes provided in a shallow portion and in a deep portion respectively in a depth direction of the silicon substrate so that light entering the silicon substrate is separated into a blue light component and a red light component by wavelength dependence of absorbance due to silicon so that optical charge generated in the shallow portion of the silicon substrate is detected and converted into a signal based on the blue light component by the photodiode located in the shallow portion whereas optical charge generated in the deep portion of the silicon substrate is detected and converted into a signal based on the red light component by the photodiode in located in the deep portion,
 wherein the solid-state image sensing device further comprises a trimming layer provided between the photoelectric conversion layer and the silicon substrate for adjusting intensity of each of respective color light components of the light which is transmitted through the photoelectric conversion layer so as to be made incident on the photodiodes.

2. The solid-state image sensing device as claimed in claim 1, wherein the trimming layer comprises a material which is formed so that spectral sensitivity characteristic of the light transmitted through both the photoelectric conversion layer and the trimming layer exhibits a peak in a wavelength range of from 500 nm to 600 nm and a half-value width of not higher than 80 nm.

3. The solid-state image sensing device as claimed in claim 2, wherein the trimming layer comprises a material which is formed so that spectral sensitivity characteristic of the light transmitted through both the photoelectric conversion layer and the trimming layer exhibits a peak in a wavelength range of from 530 nm to 570 nm and a half-value width of not higher than 50 nm.

4. The solid-state image sensing device as claimed in claim 1, wherein the photodiode located in the shallow portion comprises a junction between a p-type semiconductor layer and an n-type semiconductor layer.

5. The solid-state image sensing device as claimed in claim 4, wherein the photodiode located in the deep portion comprises a junction between the n-type semiconductor layer and a p-type semiconductor substrate.

6. The solid-state image sensing device as claimed in claim 1, wherein the photoelectric conversion layer is wider than both of the photodiodes.

7. The solid-state image sensing device as claimed in claim 1, wherein a pixel electrode layer extends between the photoelectric conversion layer and the photodiodes.

* * * * *